United States Patent
Kim

(10) Patent No.: US 9,941,283 B2
(45) Date of Patent: Apr. 10, 2018

(54) SEMICONDUCTOR DEVICE HAVING FIN-TYPE PATTERN

(71) Applicant: Ju-Youn Kim, Suwon-si (KR)

(72) Inventor: Ju-Youn Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/052,234

(22) Filed: Feb. 24, 2016

(65) Prior Publication Data

US 2016/0372472 A1    Dec. 22, 2016

(30) Foreign Application Priority Data

Jun. 18, 2015   (KR) .................. 10-2015-0086344

(51) Int. Cl.
*H01L 27/092*    (2006.01)
*H01L 29/78*     (2006.01)
*H01L 29/51*     (2006.01)

(52) U.S. Cl.
CPC ........ *H01L 27/0924* (2013.01); *H01L 29/513* (2013.01); *H01L 29/517* (2013.01); *H01L 29/518* (2013.01); *H01L 29/785* (2013.01)

(58) Field of Classification Search
CPC .......................... H01L 23/535; H01L 27/0924; H01L 29/0847
See application file for complete search history.

(56) References Cited

U.S. PATENT DOCUMENTS 7,696,046 B2    4/2010   Kim et al.
8,084,311 B1   12/2011   Horak et al.
8,232,607 B2    7/2012   Edge et al.
8,623,730 B2    1/2014   Fan et al.
8,802,527 B1    8/2014   Frank et al.
8,846,477 B2    9/2014   Cai et al.
8,889,552 B2   11/2014   Park et al.
8,900,934 B2   12/2014   Adam et al.
8,946,027 B2    2/2015   Anderson et al.
(Continued)

FOREIGN PATENT DOCUMENTS

KR    100200072    3/1999
KR    100444301    8/2004

OTHER PUBLICATIONS

Intel "Broadwell SR217 Core M-5Y10 Microprocessor Tri-Gate 13 nm Process Structural Analysts." Chipworks. Dec. 16, 2014, pp. 1, 3, 4, 7 and 126.

*Primary Examiner* — Dung Le
(74) *Attorney, Agent, or Firm* — F. Chau & Associates, LLC

(57) ABSTRACT

A semiconductor device is provided. The semiconductor device includes a first fin-type pattern on a substrate, a first interlayer insulating layer on the substrate, covering the first fin-type pattern and including a first trench, the first trench intersecting the first fin-type pattern, a first gate electrode on the first fin-type pattern, filling the first trench, an upper surface of the first gate electrode being coplanar with an upper surface of the first interlayer insulating layer, a capping layer extending along the upper surface of the first interlayer insulating layer and along the upper surface of the first gate electrode, and a second interlayer insulating layer on the capping layer, the second interlayer insulating layer including a material different from that of the capping layer.

20 Claims, 23 Drawing Sheets

(56) References Cited

U.S. PATENT DOCUMENTS

| | | | |
|---|---|---|---|
| 2014/0370699 A1 | 12/2014 | Kim et al. | |
| 2015/0004783 A1* | 1/2015 | Lee | H01L 21/76843 438/653 |
| 2015/0041854 A1* | 2/2015 | Wang | H01L 21/76856 257/190 |
| 2015/0076624 A1 | 3/2015 | Liu et al. | |
| 2015/0228730 A1* | 8/2015 | Yang | H01L 29/207 257/369 |
| 2015/0263138 A1* | 9/2015 | Kim | H01L 29/66818 438/283 |
| 2016/0079124 A1* | 3/2016 | Yin | H01L 21/823437 438/283 |
| 2016/0079354 A1* | 3/2016 | Park | H01L 27/0886 257/386 |
| 2016/0163860 A1* | 6/2016 | Lee | H01L 29/7848 257/192 |
| 2016/0233164 A1* | 8/2016 | Choi | H01L 23/535 |
| 2016/0336194 A1* | 11/2016 | Yeh | H01L 21/283 |

* cited by examiner

1200

1300

1400

SEMICONDUCTOR DEVICE HAVING FIN-TYPE PATTERN

CROSS-REFERENCE TO RELATED APPLICATION

This application claims priority under 35 U.S.C. § 119 to Korean Patent Application No. 10-2015-0086344, filed on Jun. 18, 2015 in the Korean Intellectual Property Office, the disclosure of which is incorporated by reference herein its entirety.

TECHNICAL FIELD

The present inventive concept relates to a semiconductor device and a method of fabricating the same.

DISCUSSION OF RELATED ART

Multigate transistors have been suggested to scale down a semiconductor device. The multigate transistors are easy to scale down, without compromising the performance of the transistors. Without increasing of a gate length of the multigate transistors, current control capability of the multi-gate transistors may be increased, and short channel effects (SCE) may be suppressed.

SUMMARY

According to an exemplary embodiment of the present inventive concept, a semiconductor device is provided as follows. A first fin-type pattern is disposed on a substrate. A first interlayer insulating layer disposed on the substrate covers the first fin-type pattern and includes a first trench intersecting the first fin-type pattern. A first gate electrode disposed on the first fin-type pattern fills the first trench. An upper surface of the first gate electrode is coplanar with an upper surface of the first interlayer insulating layer. A capping layer covers the upper surface of the first interlayer insulating layer and the upper surface of the first gate electrode. A second interlayer insulating layer is disposed on the capping layer. The second interlayer insulating layer includes a material different from that of the capping layer.

According to an exemplary embodiment of the present inventive concept, a semiconductor device is provided as follows. A first interlayer insulating layer covers a fin-type pattern and includes a trench intersecting the fin-type pattern. A metal gate electrode is disposed on the fin-type pattern and fills the trench. A capping layer is disposed on an upper surface of the first interlayer insulating layer and on an upper surface of the metal gate electrode. The capping layer is in contact with the metal gate electrode. A second interlayer insulating layer is disposed on the capping layer and includes a material different from that of the capping layer.

According to an exemplary embodiment of the present inventive concept, a semiconductor device is provided as follows. A first interlayer insulating layer covering a fin-type pattern includes a trench. The trench intersects the fin-type pattern and exposes a portion of the fin-type pattern. An interfacial layer is disposed on the portion of the fin-type pattern. A high-k dielectric insulating layer is disposed on the interfacial layer and is disposed along a sidewall and a bottom surface of the trench. A gate electrode is disposed on the high-k dielectric insulating layer and fills the trench. A silicon nitride (SiN) capping layer is disposed on an upper surface of the first interlayer insulating layer and on an upper surface of the gate electrode. A second interlayer insulating layer is disposed on the SiN capping layer and includes oxide.

According to an exemplary embodiment of the present inventive concept, a semiconductor device is provided as follows. A transistor includes a fin-type active pattern, a source/drain and a metal gate electrode. The metal gate electrode is disposed on an upper surface of the fin-type active pattern and the source/drain is disposed on a sidewall of the fin-type active pattern. A capping layer covers the transistor. A first interlayer insulating layer is interposed between the capping layer and the source/drain. An upper surface of the first interlayer insulating layer and an upper surface of the metal gate electrode are substantially coplanar.

According to an exemplary embodiment of the present inventive concept, a method of fabricating a semiconductor device is provided as follows. A dummy gate electrode is formed on a fin-type pattern. The dummy gate electrode intersects the fin-type pattern. A first interlayer insulating layer covering the fin-type pattern is formed to expose an upper surface of the dummy gate electrode. The dummy gate electrode is removed to form a trench exposing the fin-type pattern. A metal electrode layer is formed to fill the trench and cover an upper surface of the first interlayer insulating layer. A metal gate electrode is formed within the trench, by removing the metal electrode layer from the upper surface of the first interlayer insulating layer. A silicon nitride (SiN) capping layer is formed on an upper surface of the metal gate electrode and on the upper surface of the first interlayer insulating layer. A second interlayer insulating layer is formed on the SiN capping layer, and the second interlayer insulating layer includes oxide.

BRIEF DESCRIPTION OF DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
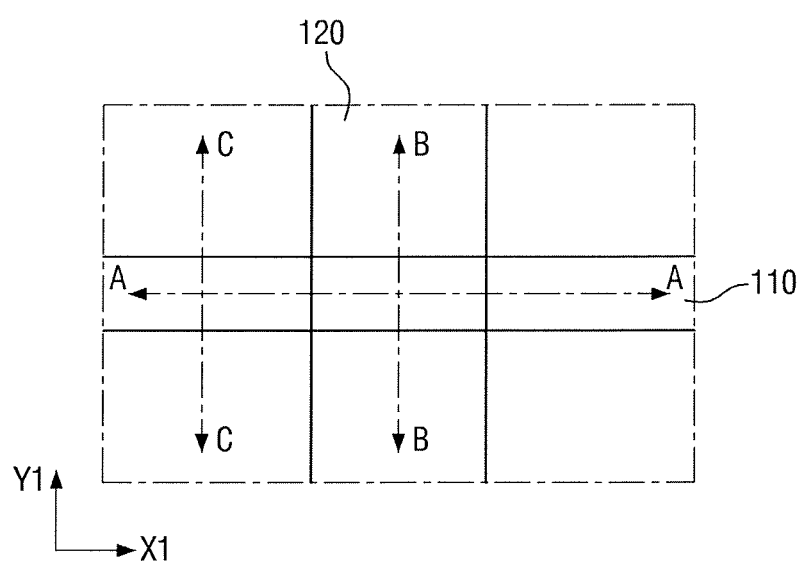
FIG. 1 is a layout diagram of a semiconductor device according to an exemplary embodiment of the present inventive concept.

Exemplary embodiments of the present inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinbelow, a semiconductor device according to an exemplary embodiment will be explained with reference to FIGS. 1 to 5B.

Figure 2:
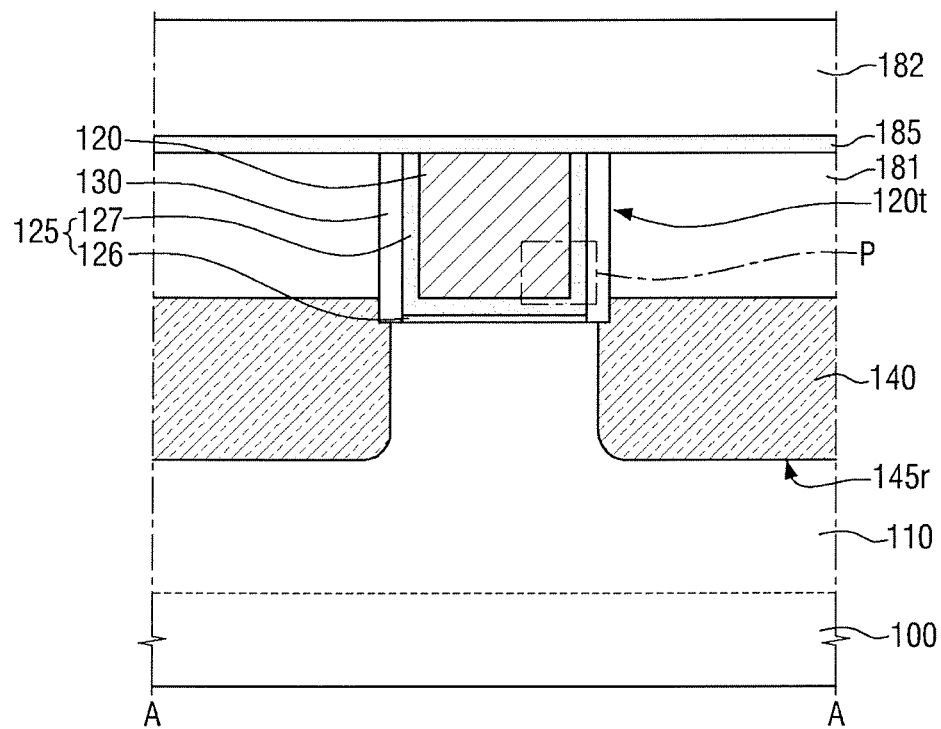
FIG. 2 is a cross sectional view taken along line A-A of FIG. 1.
Figure 3:
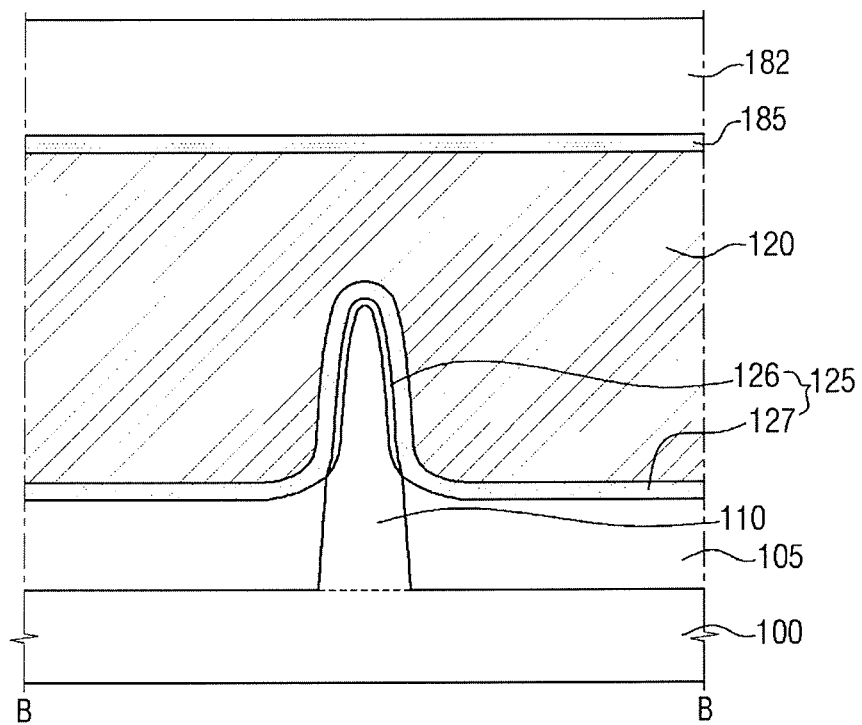
FIG. 3 is a cross sectional view taken along line B-B of FIG. 1.
Figure 4:
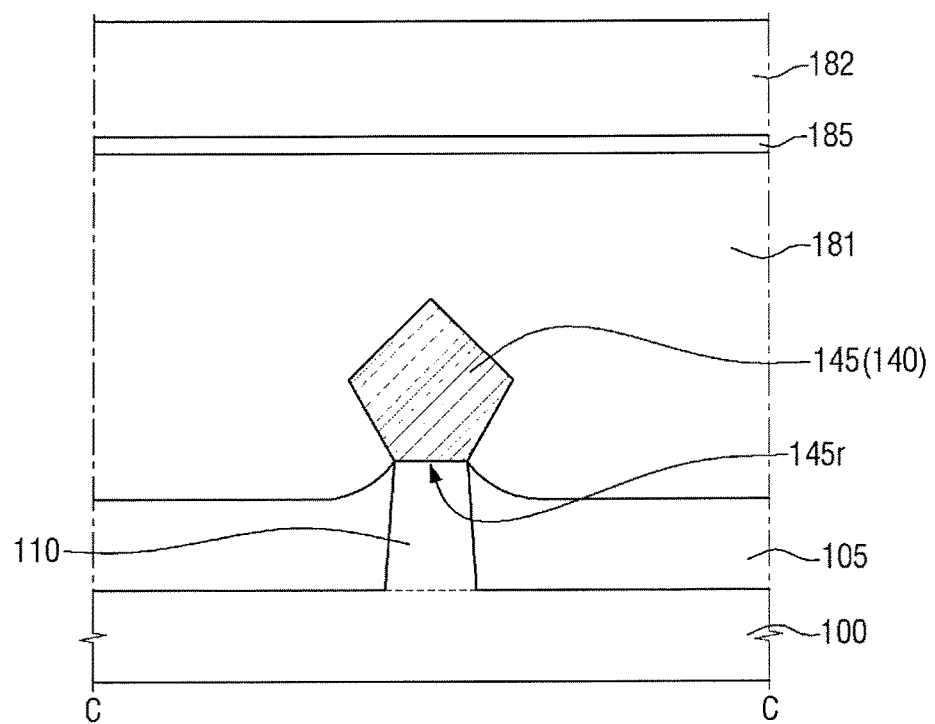
FIG. 4 is a cross sectional view taken along line C-C of FIG. 1.
Figure 5A:
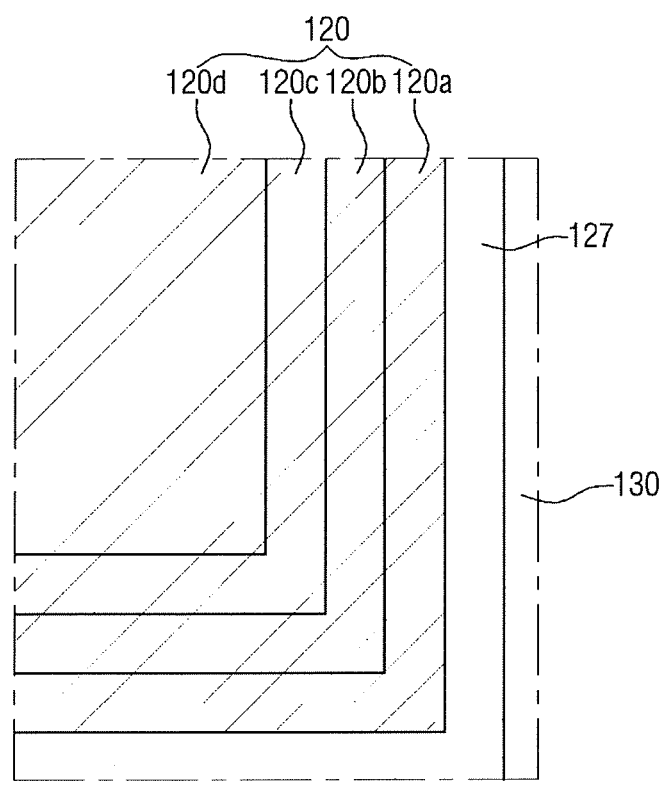
FIGS. 5A and 5B are enlarged views of the squared area P of FIG. 2.
Figure 5B:
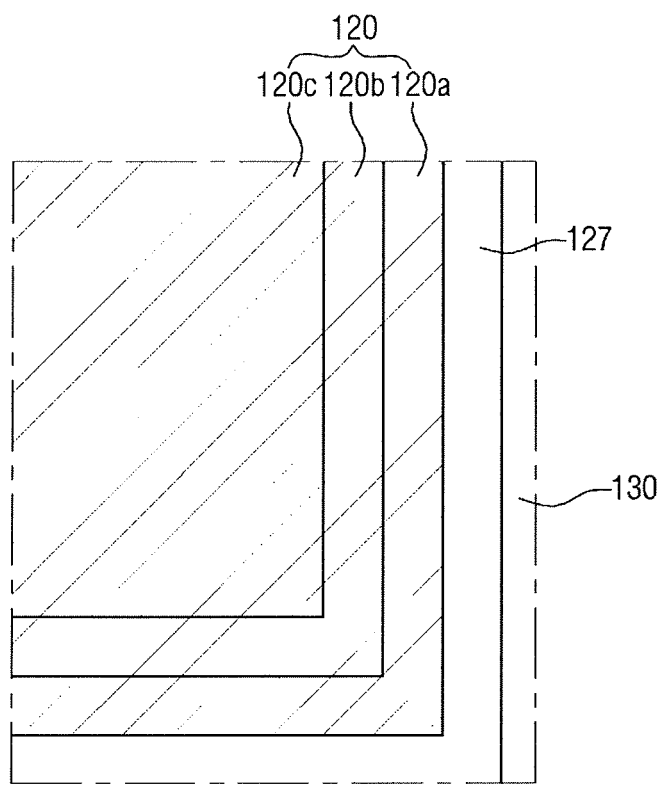

FIG. 1 is a layout of a semiconductor device according to an exemplary embodiment; FIG. 2 is a cross sectional view taken along line A-A of FIG. 1. FIG. 3 is a cross sectional view taken along line B-B of FIG. 1. FIG. 4 is a cross sectional view taken along line C-C of FIG. 1. FIGS. 5A and 5B are enlarged views of the squared area P of FIG. 2 according to an exemplary embodiment. For the convenience of a description, the layout of FIG. 1 will be used later to describe other semiconductor devices 2-5.

In an exemplary embodiment, a semiconductor device may include a fin-type pattern channel region therein, but the present inventive concept is not limited thereto. For example, the semiconductor device may include a wire-pattern channel region.

Referring to FIGS. 1 to 4, a semiconductor device 1 according to an exemplary embodiment may include a substrate 100, a first fin-type pattern 110, a first gate electrode 120, a first source/drain 140, and a capping layer 185.

The substrate 100 may be a bulk silicon or a silicon-on-insulator (SOI), for example. In an exemplary embodiment, the substrate 100 may be a silicon substrate, or may include silicon germanium, indium antimonide, lead telluride compound, indium arsenide, indium phosphide, gallium arsenide, or gallium antimonide. In an exemplary embodiment, the substrate 100 may be a base substrate having an epitaxial layer formed thereon.

The first fin-type pattern 110 may protrude from the substrate 100. The first fin-type pattern 110 may be extended in a first direction X1.

The first fin-type pattern 110 may serve as an active pattern of a multigate transistor. For example, the first fin-type pattern 110 may include channels formed along three surfaces of the fin. Two adjacent surfaces of the fin may be connected to each other. In an exemplary embodiment, the first fin-type pattern 110 may be the channels formed on two opposite surfaces of the fin.

In an exemplary embodiment, the first fin-type pattern 110 may be a part of the substrate 100. For example, the first fin-type pattern 100 may be patterned from the substrate using an etching process. In an exemplary embodiment, the first fin-type pattern 100 may be a pattern epitaxially grown from the substrate 100.

The first fin-type pattern 110 may include a semiconductor material such as silicon or germanium, for example. In an exemplary embodiment, the first fin-type pattern 110 may include a compound semiconductor such as IV-IV group compound semiconductor or III-V group compound semiconductor.

The IV-IV group compound semiconductor, for instance, may include a binary compound or a ternary compound including, for example, carbon (C), silicon (Si), germanium (Ge), and tin (Sn), or the above-mentioned binary or ternary compound doped with IV group element.

The III-V group compound semiconductor, for instance, may include a binary compound, a ternary compound or a quaternary compound which is formed by a combination of a III group element which may include aluminum (Al), gallium (Ga), and indium (In), with a V group element which may include phosphorus (P), arsenic (As) or antimony (Sb).

For the convenience of description, it is assumed that the first fin-type pattern 110 is a silicon fin-type pattern which includes silicon.

A field insulating layer 105 may be formed on the substrate 100. The field insulating layer 105 may partially cover a side surface of the first fin-type pattern 110. Accordingly, an upper surface of the first fin-type pattern 110 may protrude upward higher than an upper surface of the field insulating layer 105. The first fin-type pattern 110 may be defined by the field insulating layer 105 on the substrate 100.

The field insulating layer 105 may include, for example, oxide, nitride, oxynitride, or a combination thereof.

A first interlayer insulating layer 181 may be formed on the substrate 100. The first interlayer insulating layer 181 may cover the first fin-type pattern 110, the first source/drain 140 and the field insulating layer 105.

The first interlayer insulating layer 181 may include a first trench 120t. The first trench 120t may extend in a second direction Y1. The first trench 120t may intersect the first fin-type pattern 110. The first fin-type pattern 110 and the field insulating layer 105 may be exposed by the first trench 120t.

For example, the first interlayer insulating layer 181 may include silicon oxide, silicon oxynitride, or a low-k dielectric material. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, a porous polymeric material, or a combination thereof, but the present inventive concept is not limited thereto.

The first gate electrode 120 may extend in the second direction Y1. The first gate electrode 120 may be formed to intersect the first fin-type pattern 110. The first gate electrode 120 may be formed by filling the first trench 120t.

The first gate electrode 120 may be formed on the first fin-type pattern 110 and the field insulating layers 105. The first gate electrode 120 may surround the first fin-type pattern 110 protruding upward higher than the upper surface of the field insulating layer 105.

For example, the first gate electrode 120 may be planarized by a planarization process so that the upper surface of the first gate electrode 120 may be coplanar with the upper surface of the first interlayer insulating layer 181.

For example, the first gate electrode 120 may include titanium (Ti), titanium nitride (TiN), tungsten nitride (WN), titanium aluminum (TiAl), titanium aluminum nitride (TiAlN), titanium aluminum carbide (TiAlC), titanium carbide (TiC), cobalt (Co), ruthenium (Ru), aluminum (Al) or tungsten (W).

For example, the first gate electrode 120 may be formed by gate replacement process (or a gate last process). For example, the first gate electrode 120 may be a replacement metal gate electrode.

A first spacer 130 may be formed on a sidewall of the first gate electrode 120 extending in the second direction Y1. The first spacer 130 may be formed on a sidewall of the first trench 120t.

For example, the first spacer 130 may include silicon nitride (SiN), silicon oxynitride (SiON), silicon oxide (SiO$_2$), silicon oxycarbonitride (SiOCN), or a combination thereof.

A first gate insulating layer 125 may be formed between the first fin-type pattern 110 and the first gate electrode 120. A first gate insulating layer 125 may be formed along the profile of the first fin-type pattern 110 protruding upward from the field insulating layer 105. The first gate insulating layer 125 may be formed on the field insulating layer 105.

The first gate insulating layer 125 may be disposed between the first gate electrode 120 and the field insulating layer 105. The first gate electrode 120 may be formed along the sidewall and a bottom surface of the first trench 120t.

Further, the first gate insulating layer 125 may be formed between the first spacer 130 and the sidewall of the first gate electrode 120.

The first gate insulating layer 125 may include a first interfacial layer 126 and a first high-k dielectric gate insulating layer 127.

The first interfacial layer 126 may be formed along the profile of the first fin-type pattern 110 protruding upward higher than the upper surface of the field insulating layer 105. In an exemplary embodiment, the first fin-type pattern 110 may be formed of silicon, and the first interfacial layer 126 may be formed of silicon oxide.

In FIG. 3, the first interfacial layer 126 need not be formed along the upper surface of the field insulating layer 105, but the present inventive concept is not limited thereto. In an exemplary embodiment, the first interfacial layer 126 may be formed between the upper surface of the field insulating layer 105 and the bottom surface of the first gate electrode 120.

The first interfacial layer 126 may be formed on the bottom surface of the first trench 120t, and need not be formed on the sidewall of the first trench 120t. The present inventive concept is not limited thereto. For example, the first interfacial layer 126 may be formed on the bottom surface and sidewall of the first trench 120t.

The first high-k dielectric gate insulating layer 127 may be formed on the first interfacial layer 126. The first high-k dielectric gate insulating layer 127 may be formed along the profile of the first fin-type pattern 110 protruding higher than the upper surface of the field insulating layer 105.

The first high-k dielectric gate insulating layer 127 may be formed between the first gate electrode 120 and the field insulating layer 105. The first gate electrode 120 may be formed on the first high-k dielectric gate insulating layer 127.

The first high-k dielectric gate insulating layer 127 may be formed along the sidewall and the bottom surface of the first trench 120t. For example, a portion of the first high-k dielectric gate insulating layer 127 may extend along the sidewall of the first trench 120t, between the first gate electrode 120 and the first interlayer insulating layer 181.

For example, the first high-k dielectric gate insulating layer 127 may include silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but the present inventive concept is not limited thereto.

The first source/drain 140 may be formed on both sides of the first gate electrode 120. The first source/drain 140 may be formed on the first fin-type pattern 110. In an exemplary embodiment, the first source/drain 140 may be an elevated source/drain.

The first source/drain 140 may be an epitaxially grown layer. The first source/drain 140 may fill a first recess 145r formed within the first fin-type pattern 110.

An outer circumference of the source/drain 140 may have various shapes. For example, the outer circumference may be at least one of diamond, circle and rectangle. FIG. 4 illustrates a diamond shape (or pentagon or hexagon shape), for an example.

When the semiconductor device 1 according to an exemplary embodiment is a P-type Metal-Oxide-Semiconductor (PMOS) transistor, the source/drain 140 may include a compressive stress material. For example, the compressive stress material may be SiGe which has a higher lattice constant compared with Si. For example, the compressive stress material may increase mobility of the carrier in the channel region formed in the first fin-type pattern 110. The channel region of the first fin-type pattern 110 may be subject to a compressive stress applied by the source/drain 140.

If the semiconductor device 1 according to an exemplary embodiment is an N-type Metal-Oxide-Semiconductor (NMOS) transistor, the source/drain 140 may include a tensile stress material. For example, when the first fin-type pattern 110 is silicon, the source/drain 140 may include a material such as SiC which has a smaller lattice constant than the silicon. For example, the tensile stress material may increase mobility of the carrier in the channel region by applying tensile stress on the first fin-type pattern 110.

A capping layer 185 may be formed on the first interlayer insulating layer 181 and the first gate electrode 120. For example, the capping layer 185 may be formed on the upper surface of the first interlayer insulating layer 181 and on the upper surface of the first gate electrode 120.

The capping layer 185 may extend along the upper surface of the first gate electrode 120 and the upper surface of the first interlayer insulating layer 181.

The first interlayer insulating layer 181 covers the first source/drain 140 formed on both sides of the first gate electrode 120. Accordingly, the capping layer 185 may be formed by extending over the first source/drain 140. For example, the capping layer 185 may overlap the first source/drain 140.

The capping layer 185 may contact the first gate electrode 120. Further, the capping layer 185 may contact the first interlayer insulating layer 181.

Since the first high-k dielectric gate insulating layer 127 is formed along the sidewall of the first trench 120*t*, the first high-k dielectric gate insulating layer 127 may contact the capping layer 185. For example, the first gate insulating layer 125 may contact the capping layer 185.

The capping layer 185 may include a different material from the first interlayer insulating layer 181. For example, the capping layer 185 may include silicon nitride.

In an exemplary embodiment, the capping layer 185 may be a silicon nitride layer.

For example, a thickness of the capping layer 185 may be equal to, or greater than about 3 Å, or equal to, or smaller than about 60 Å. In an exemplary embodiment, a thickness of the capping layer 185 may range between about 3 Å and about 60 Å.

A second interlayer insulating layer 182 may be formed on the capping layer 185. For example, the second interlayer insulating layer 182 may be in contact with the capping layer 185.

The second interlayer insulating layer 182 may include a different material from the capping layer 185. The capping layer 185 may include a material that has etch selectivity to the second interlayer insulating layer 182.

For example, the second interlayer insulating layer 182 may include oxide. For example, the second interlayer insulating layer 182 may include silicon oxide, flowable oxide (FOX), Tonen silazene (TOSZ), undoped silica glass (USG), borosilicate glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), tetra ethyl ortho silicate (TEOS), organo silicate glass (OSG), or a combination thereof, but the present inventive concept is not limited thereto.

The capping layer 185 may prevent ingress of oxygen into the first gate electrode 120. For example, the second interlayer insulating layer 182 formed on the capping layer 185 may include oxide, and the capping layer 185 may serve to block the oxygen of the second interlayer insulating layer 182 from being diffused into the capping layer 185.

In the process of manufacturing the semiconductor device 1, oxygen may diffuse from the oxide-containing, second interlayer insulating layer 182 and enter the first gate electrode 120. When the oxygen enters the first gate electrode 120 as described above, the threshold voltage of the first gate electrode 120 may change.

However, the capping layer 185, which is silicon nitride layer interposed between the first gate electrode 120 and the second interlayer insulating layer 182, may block oxygen diffusion from the second interlayer insulating layer 182 into the first gate electrode 120.

As such, the threshold voltage of the first gate electrode 120 may remain unchanged in the manufacturing of the semiconductor device 1.

Referring to FIGS. 5A and 5B, for example, the first gate electrode 120 may have a multi-layered stack structure which includes a plurality of layers stacked on each other.

Referring to FIG. 5A, the first gate electrode 120 may include a first TiN layer 120*a*, a TiAlC layer 120*b*, and a second TiN layer 120*c* formed in sequence on the first high-k dielectric gate insulating layer 127. A tungsten (W) layer 120*d* may fill a space defined by the second TiN layer 120*c*.

The TiAlC layer 120*b* may be in contact with the first TiN layer 120*a* and the second TiN layer 120*c*.

Referring to FIG. 5B, the first gate electrode 120 may include a first TiN layer 120*a*, a TiAlC layer 120*b*, and a second TiN layer 120*c* formed in sequence on the first high-k dielectric gate insulating layer 127.

The first gate electrode 120 of FIG. 5B need not include the tungsten (W) layer 120*d* of FIG. 5A.

The space defined by the TiAlC layer 120*b* may be filled by the second TiN layer 120*c*.

Figure 6:
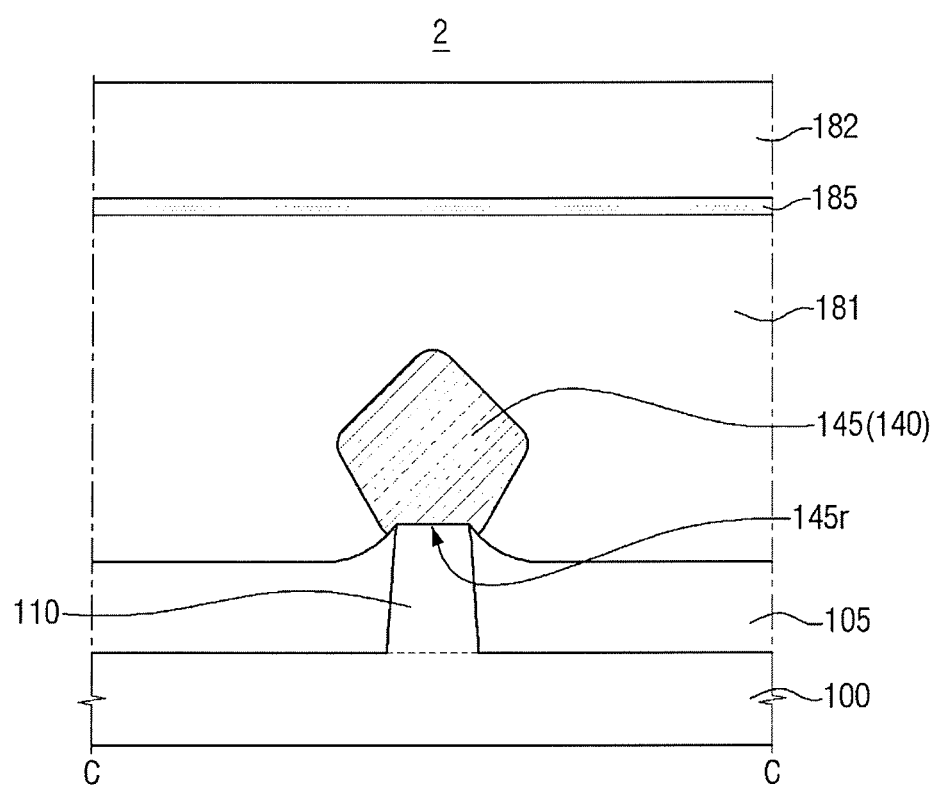
FIG. 6 shows a semiconductor device according to an exemplary embodiment of the present inventive concept.

FIG. 6 shows a semiconductor device 2 according to an exemplary embodiment. For the convenience of a description, differences that are not explained above with reference to FIGS. 1 to 5B will be described below.

Referring to FIGS. 1 and 6, in the semiconductor device 2, a portion of an outer circumference of the source/drain 140 may extend along the upper surface of the field insulating layer 105.

For example, the outer circumference of the source/drain 140 may be in contact with the upper surface of the field insulating layer 105, overlapping a portion of the upper surface of the field insulating layer 105.

Figure 7:
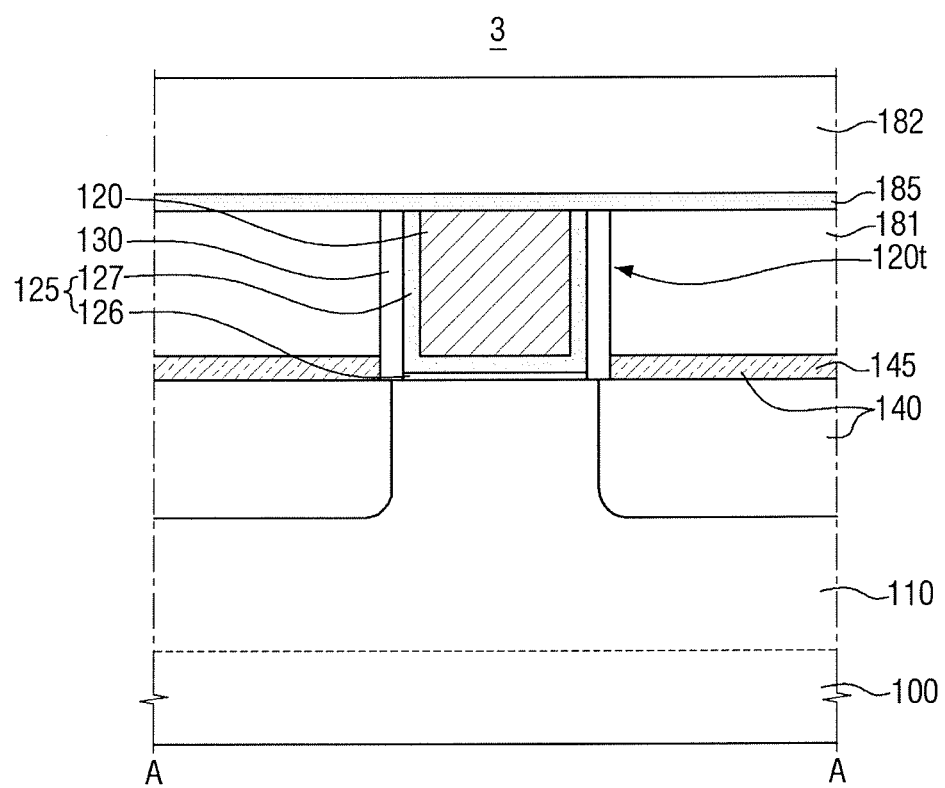
FIGS. 7 and 8 show a semiconductor device according to an exemplary embodiment of the present inventive concept.
Figure 8:
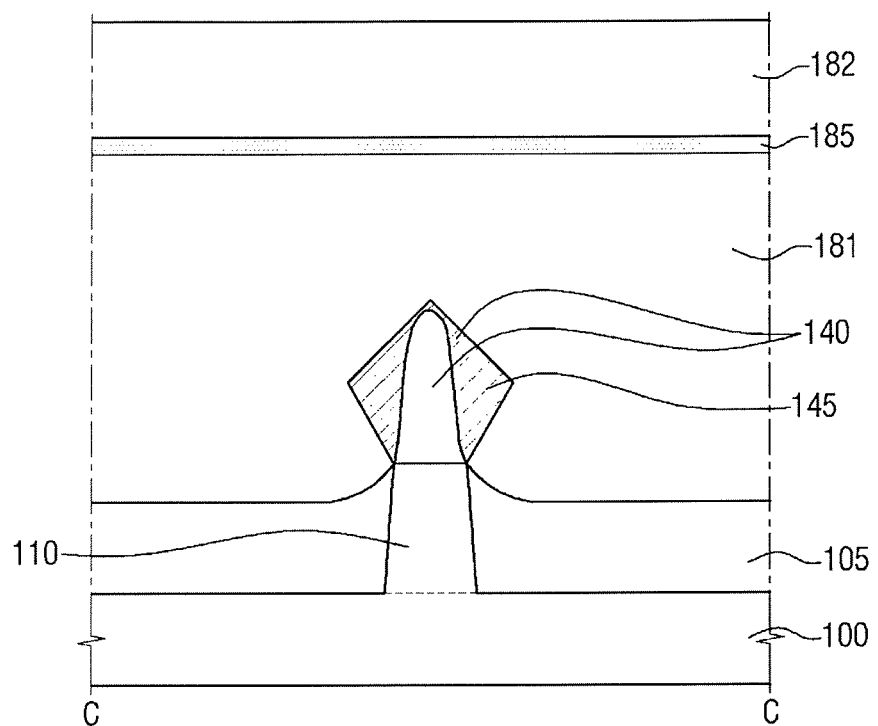

FIGS. 7 and 8 show a semiconductor device 3 according to an exemplary embodiment. For the convenience of a description, differences that are not explained above with reference to FIGS. 1 to 5B will be described below.

Referring to FIGS. 1, 7 and 8, the semiconductor device 3 may include the first source/drain 140 which is formed of an epitaxial layer formed along the profile of the first fin-type pattern 110 which protrudes upward higher than the upper surface of the field insulating layer 105.

In an exemplary embodiment, the first fin-type pattern 110 is a silicon-containing fin-type pattern, and the source/drain 140 may include, for example, silicon, silicon germanium, germanium, or silicon carbide. The present inventive concept is not limited thereto.

Figure 9:
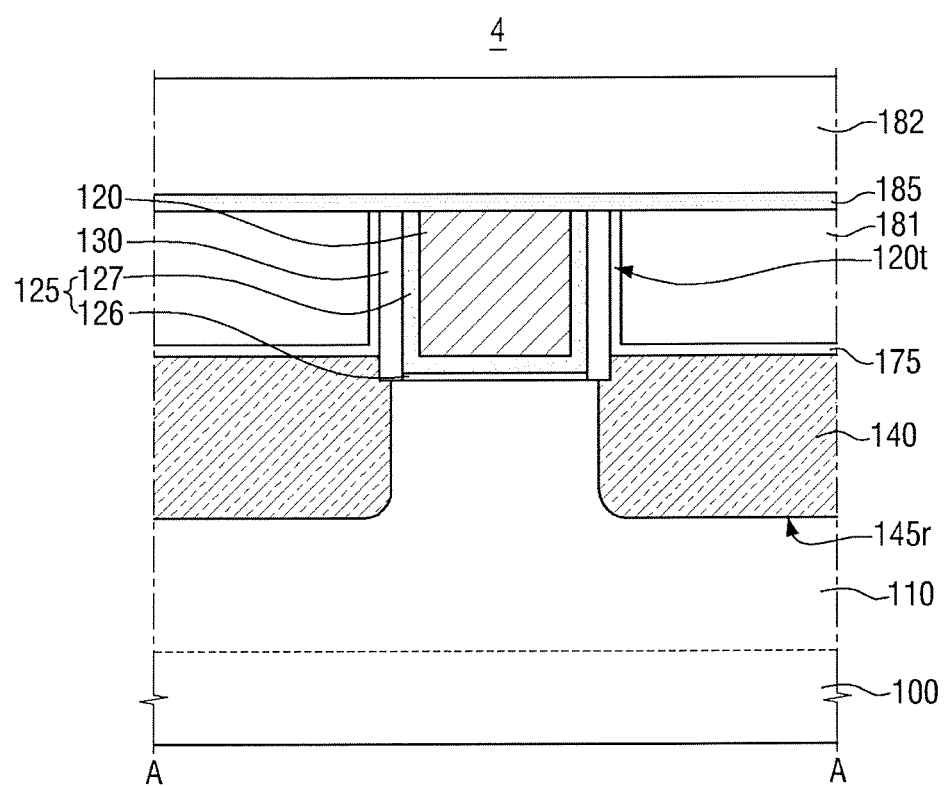
FIGS. 9 and 10 show a semiconductor device according to an exemplary embodiment of the present inventive concept.
Figure 10:
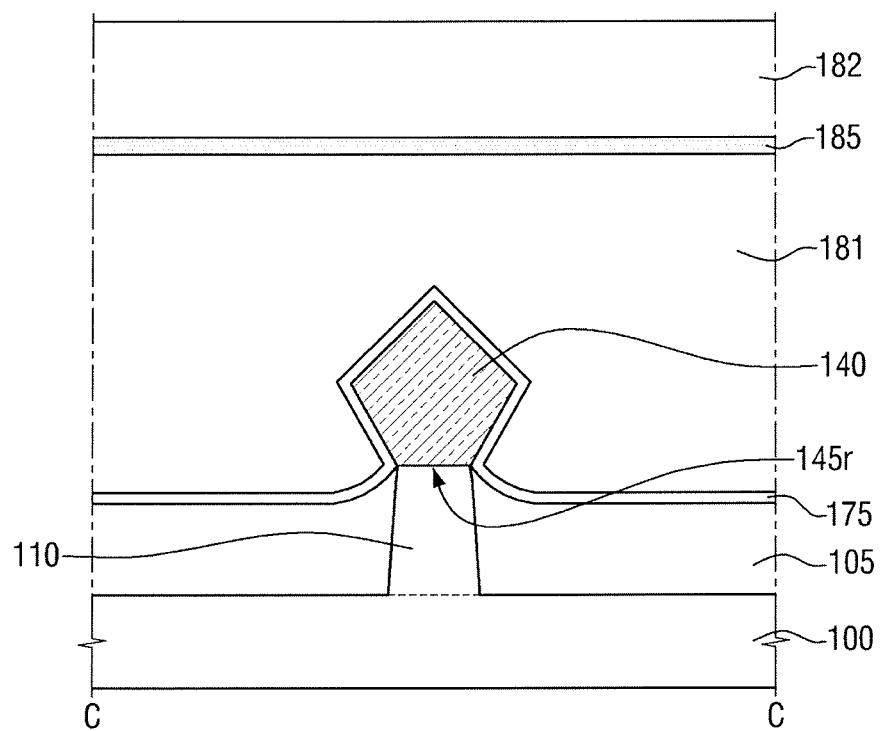

FIGS. 9 and 10 show a semiconductor device according to an exemplary embodiment. For the convenience of a description, differences that are not described with reference to FIGS. 1 to 5B will be described below.

Referring to FIGS. 1, 9 and 10, the semiconductor device 4 may include an etch-stop layer 175 between the first source/drain 140 and the first interlayer insulating layer 181.

The etch-stop layer 175 may be formed along the outer circumference of the first source/drain 140. The etch-stop layer 175 may be formed along the upper surface of the field insulating layer 105.

The etch-stop layer 175 may be formed along an outer sidewall of the first spacer 130. The etch-stop layer 175 formed along the outer sidewall of the first spacer 130 may be in contact with the capping layer 185.

The first interlayer insulating layer 181 may be formed between the etch-stop layer 175 and the capping layer 185.

For example, the etch-stop layer 175 may include silicon nitride (SiN), silicon oxynitride (SiON), silicon oxide (SiO$_2$), silicon oxycarbonitride (SiOCN), silicon carbonitride (SiCN), or a combination thereof.

Figure 11:
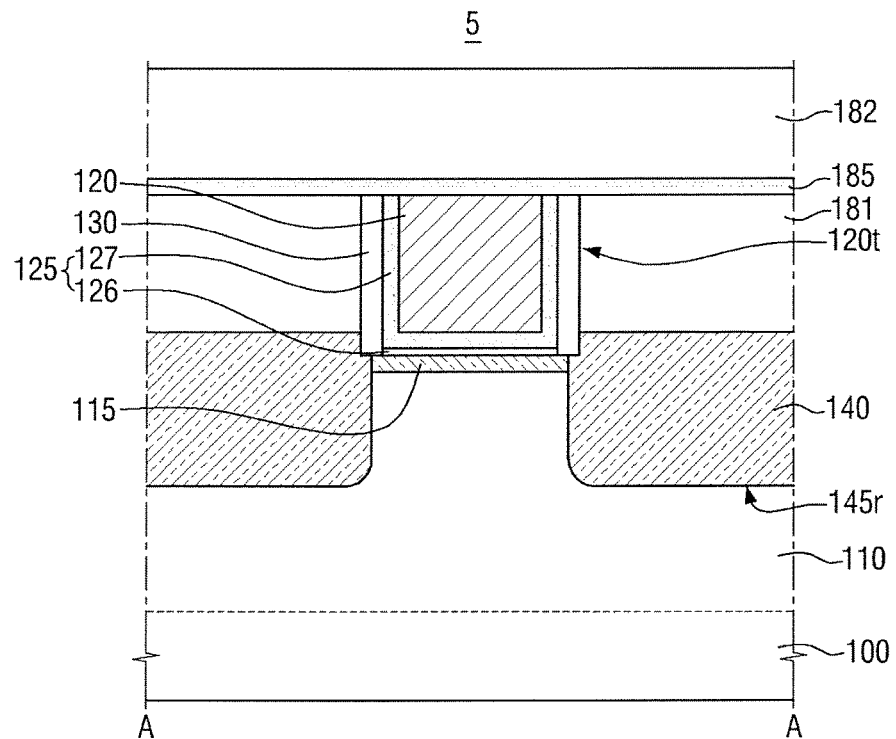
FIG. 11 shows a semiconductor device according to an exemplary embodiment of the present inventive concept.

FIG. 11 shows a semiconductor device 5 according to an exemplary embodiment. For the convenience of a description, differences that are not described above with reference to FIGS. 1 to 5B will be described below.

Referring to FIGS. 1 and 11, the semiconductor device 5 may include a channel layer 115 formed between the first fin-type pattern 110 and the first gate electrode 120.

For example, the channel layer 115 may be formed between the first fin-type pattern 110 and the first gate insulating layer 125. For example, the channel layer 115 may be formed on the upper surface of the first fin-type pattern 110.

The channel layer 115 may include a material which is different from the material that forms the first fin-type pattern 110. For example, the first fin-type pattern 110 is a silicon fin-type pattern, and the channel layer 115 may include silicon germanium which has a greater lattice constant than silicon. For example, the channel layer 115 may be a silicon germanium channel layer.

Figure 12:
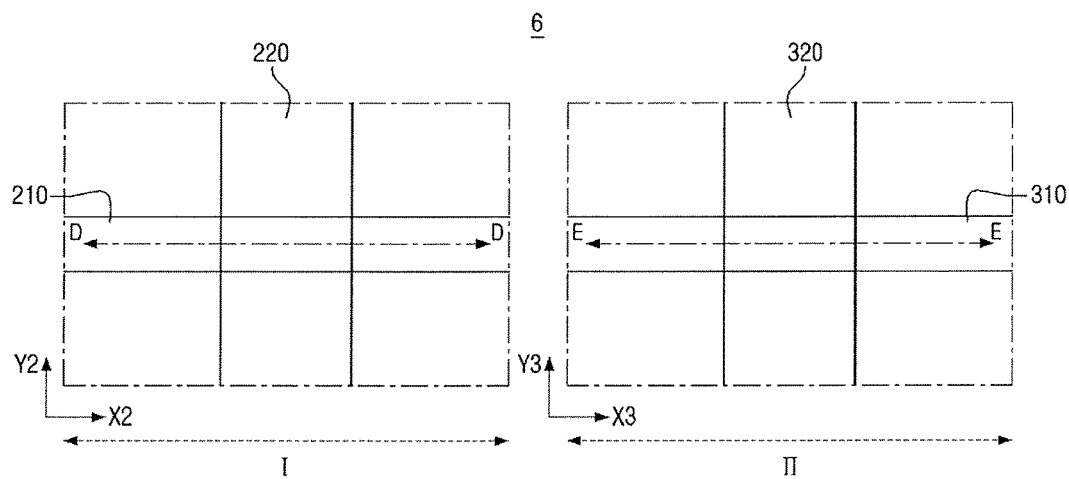
FIG. 12 is a layout diagram of a semiconductor device according to an exemplary embodiment of the present inventive concept.
Figure 13:
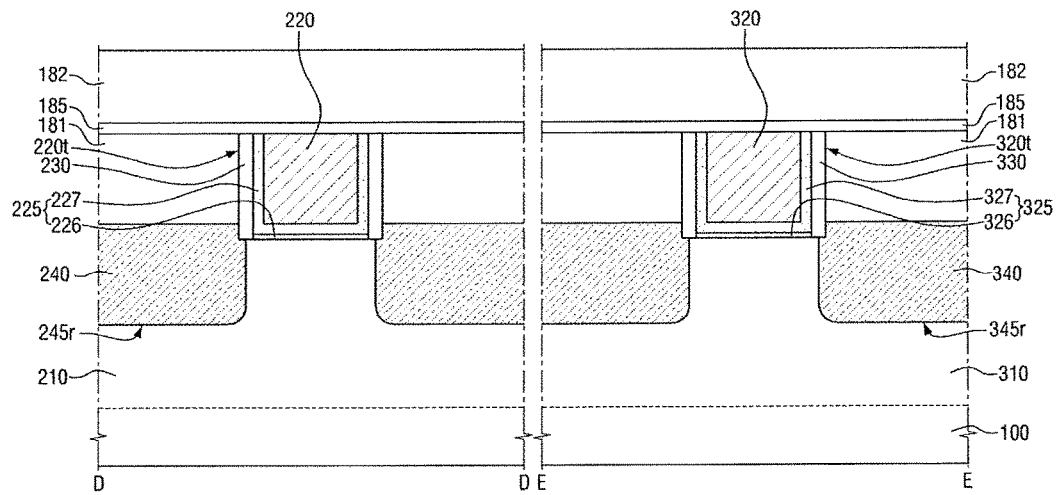
FIG. 13 is a cross sectional view taken along line D-D and line E-E of FIG. 12.

FIG. 12 is a layout diagram of a semiconductor device according to an exemplary embodiment. FIG. 13 is a cross sectional view taken along line D-D and line E-E of FIG. 12.

It is to be noted that the cross sectional views taken along lines D-D and E-E of FIG. 12 are illustrated in a similar manner as the cross sectional views of FIG. 2 for the convenience of a description. The present inventive concept is not limited thereto. For example, the cross sectional views taken on lines D-D and E-E of FIG. 12 may be similar to any of FIGS. 2, 7, 9 and 11.

Referring to FIGS. 12 and 13, the semiconductor device 6 may include a second fin-type pattern 210, a third fin-type pattern 310, a second gate electrode 220, a third gate electrode 320, a second source/drain 240, a third source/drain 340, and a capping layer 185.

The substrate 100 may include a first region I and a second region II. The first region I and the second region II may be spaced apart from each other. In an exemplary embodiment, the first region I and the second region II may be connected to each other.

The first region I may include an N-type transistor region, and the second region II may include a P-type transistor region. In an exemplary embodiment, the first region I may include a P-type transistor region, and the second region II may include an N-type transistor region.

The first interlayer insulating layer 181 formed on the substrate 100 may cover the second fin-type pattern 210, the third fin-type pattern 310, the second source/drain 240 and the third source/drain 340. The first interlayer insulating layer 181 may include a second trench 220t formed in the first region I, and a third trench 320t formed in the second region II.

A second fin-type pattern 210, a second gate electrode 220 and a second source/drain 240 may be formed in the first region I.

The second fin-type pattern 210 may protrude from the substrate 100. The second fin-type pattern 210 may be extended in a third direction X2.

The second gate electrode 220 may extend in a fourth direction Y2. The second gate electrode 220 may be formed to intersect the second fin-type pattern 210. The second gate electrode 220 may extend in the fourth direction Y2, and may be formed by filling the second trench 220t intersecting the second fin-type pattern 210.

The upper surface of the second gate electrode 220 may be coplanar with the upper surface of the first interlayer insulating layer 181.

A second spacer 230 may be formed on a sidewall of the second gate electrode 220 extending in the fourth direction Y2. The second spacer 230 may be formed on a sidewall of the second trench 220t.

Figure 15:
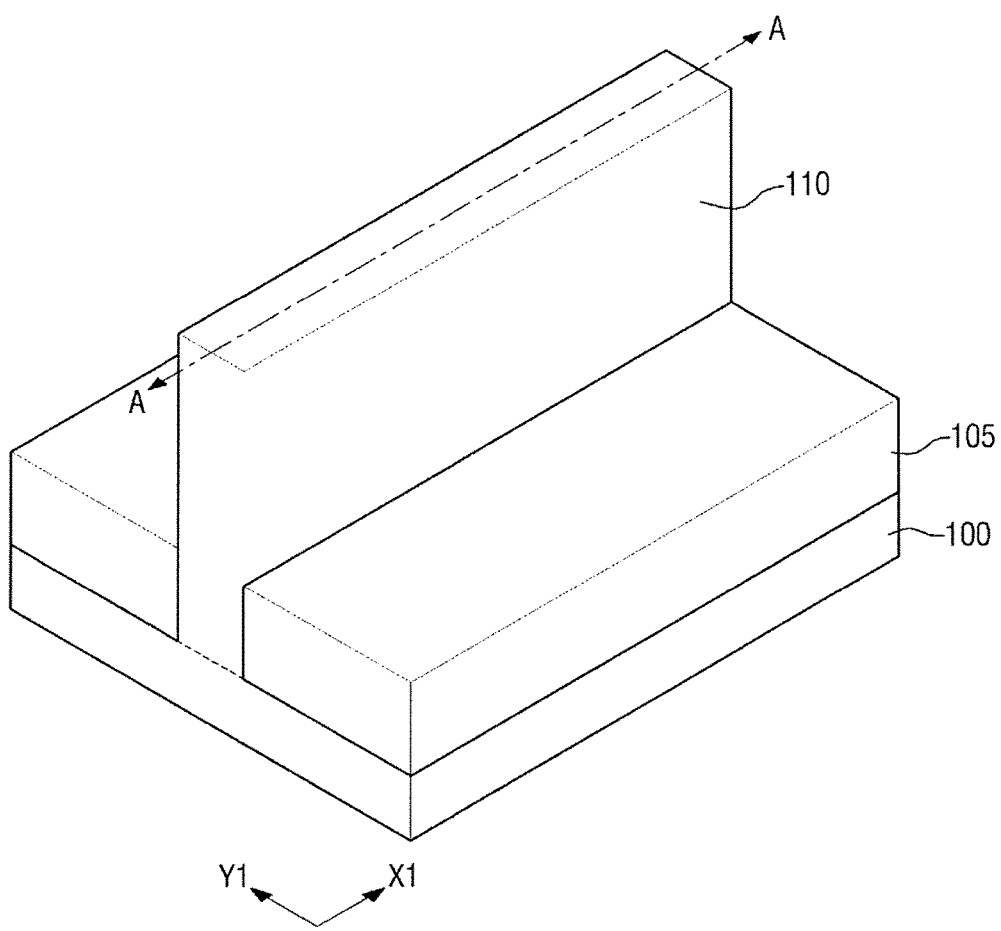
FIGS. 15 to 22 show a method of fabricating a semiconductor device according to an exemplary embodiment of the present inventive concept.

A second gate insulating layer 225 may be formed between the second fin-type pattern 210 and the second gate electrode 220. The second gate insulating layer 225 may be formed along the profile of the second fin-type pattern 210 protruding upward higher than the field insulating layer 105, as shown in FIG. 15.

The second gate insulating layer 225 may be disposed between the second gate electrode 220 and the field insulating layer 105. The second gate electrode 225 may be formed along the sidewall and a bottom surface of the second trench 220t.

Further, the second gate insulating layer 225 may be formed between the second spacer 230 and the sidewall of the second gate electrode 220.

The second gate insulating layer 225 may include a second interfacial layer 226 and a second high-k dielectric gate insulating layer 227.

The second source/drain 240 may be formed on both sides of the second gate electrode 220. The second source/drain 240 may be formed on the second fin-type pattern 210. In an exemplary embodiment, the second source/drain 240 may be an elevated source/drain.

The second source/drain 240 may be formed of an epitaxial layer. The second source/drain 240 may fill a second recess 245r formed within the second fin-type pattern 210.

The second source/drain 240 may be doped with various impurities depending on whether the semiconductor device formed in the first region I is an NMOS transistor or a PMOS transistor.

A third fin-type pattern 310, a third gate electrode 320 and a third source/drain 340 may be formed in the second region II.

The third fin-type pattern 310 may protrude from the substrate 100. The third fin-type pattern 310 may be extended in a fifth direction X3.

The third gate electrode 320 may extend in a sixth direction Y3. The third gate electrode 320 may be formed to intersect the third fin-type pattern 310. The third gate electrode 320 may extend in the sixth direction Y3, and may be formed by filling the third trench 320t intersecting the third fin-type pattern 310.

The upper surface of the third gate electrode 320 may be coplanar with the upper surface of the first interlayer insulating layer 181.

A third spacer 330 may be formed on a sidewall of the third gate electrode 320 extending in the sixth direction Y3. The third spacer 330 may be formed on a sidewall of the third trench 320t.

A third gate insulating layer 325 may be formed between the third fin-type pattern 310 and the third gate electrode 320. The third gate insulating layer 325 may be formed along the profile of the third fin-type pattern 310 protruding upward higher than the field insulating layer 105.

The third gate insulating layer 325 may be disposed between the third gate electrode 320 and the field insulating layer 105. The third gate electrode 325 may be formed along the sidewall and a bottom surface of the third trench 320t.

Further, the third gate insulating layer 325 may be formed between the third spacer 330 and the sidewall of the third gate electrode 320.

The third gate insulating layer 325 may include a third interfacial layer 326 and a third high-k dielectric gate insulating layer 327.

The third source/drain 340 may be formed on both sides of the third gate electrode 320. The third source/drain 340 may be formed on the third fin-type pattern 310. In an exemplary embodiment, the third source/drain 340 may be an elevated source/drain.

The third source/drain 340 may be formed of an epitaxial layer. The third source/drain 340 may fill a third recess 345r formed within the third fin-type pattern 310.

The third source/drain 340 may be doped with various impurities depending on whether the semiconductor device formed in the second region II is an NMOS transistor or a PMOS transistor.

The description about the second fin-type pattern 210 and the third fin-type pattern 310 may be similar to that of the first fin-type pattern 110. Further, the description about the second gate electrode 220 and the third gate electrode 320 may be similar to that of the first gate electrode 120.

The capping layer 185 may span the first region I and the second region II. For example, the capping layer 185 may be formed on the first interlayer insulating layer 181, the second gate electrode 220 and the third gate electrode 320. The capping layer 185 may be formed on the upper surface of the first interlayer insulating layer 181, the upper surface of the second gate electrode 220 and the upper surface of the third gate electrode 320.

The capping layer 185 may extend along the upper surface of the second gate electrode 220, the upper surface of the third gate electrode 320, and the upper surface of the first interlayer insulating layer 181.

Further, the capping layer 185 may extend over the second source/drain 240 and the third source/drain 340, respectively.

The capping layer 185 may contact the second gate electrode 220, the third gate electrode 320, and the first interlayer insulating layer 181. Additionally, the capping layer 185 may contact the second high-k dielectric gate insulating layer 227 and the third high-k dielectric gate insulating layer 327.

Figure 14:
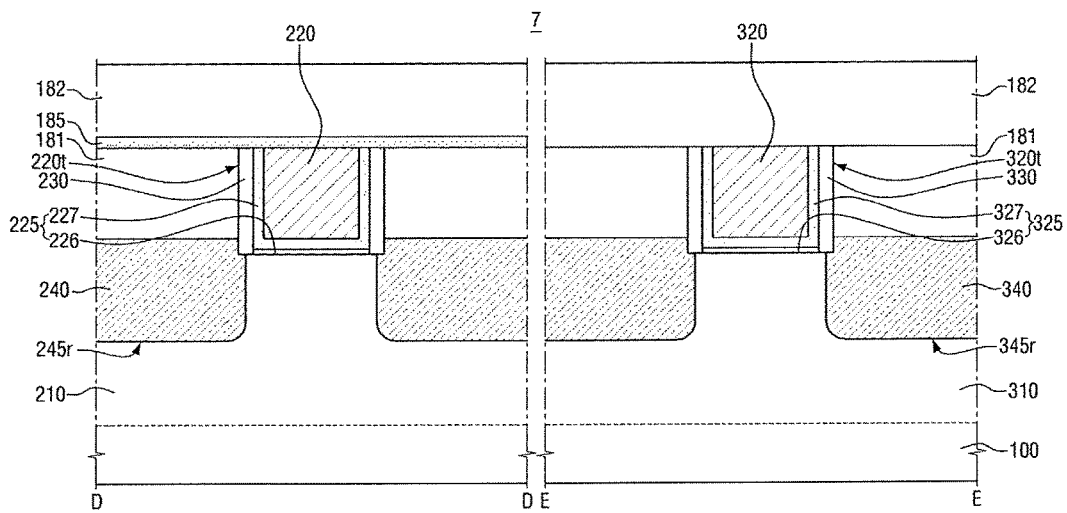
FIG. 14 is a cross sectional view of a semiconductor device according to an exemplary embodiment of the present inventive concept.

FIG. 14 shows a semiconductor device 7 according to an exemplary embodiment. For convenience of explanation, differences that are not explained above with reference to FIGS. 12 and 13 will be mainly explained below.

Referring to FIGS. 12 and 14, the semiconductor device 7 may include the capping layer 185 which is formed on the first region I, and which need not be formed on the second region II.

In the first region I, the capping layer 185 may be formed between the first interlayer insulating layer 181 and the second interlayer insulating layer 182.

However, in the second region II, the capping layer 185 need not be interposed between the first interlayer insulating layer 181 and the second interlayer insulating layer 182. In this case, the first interlayer insulating layer 181 and the second interlayer insulating layer 182 may be in contact with each other.

Further, the capping layer 185 is not formed on the third gate electrode 320, and the upper surface of the third gate electrode 320 may be in contact with the lower surface of the second interlayer insulating layer 182.

Hereinbelow, a method of fabricating a semiconductor device according to an exemplary embodiment will be described with reference to FIGS. 2 and 15 to 22.

FIGS. 15 to 22 show a method of fabricating a semiconductor device according to an exemplary embodiment.

Referring to FIG. 15, the first fin-type pattern 110 may be formed on the substrate 100. The first fin-type pattern 110 may be extended in the first direction X.

The field insulating layer 105 may be formed on the substrate 100. The field insulating layer 105 may partially surround the first fin-type pattern 110.

For example, the first fin-type pattern 110 may include a portion that protrudes upward higher than the upper surface of the field insulating layer 105.

The following description may refer to the cross sectional view of the first fin-type pattern 110 taken along line A-A of FIG. 15.

Figure 16:
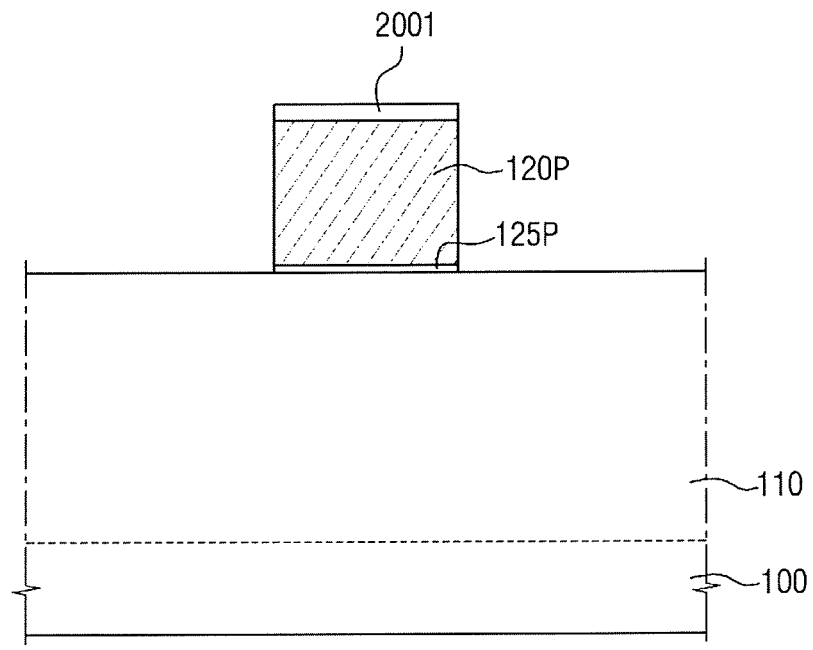

Referring to FIG. 16, an etching process may be performed using a mask pattern 2001, thus forming a dummy gate electrode 120P intersecting the first fin-type pattern 110.

The dummy gate electrode 120P may extend in the second direction Y1.

Further, a dummy gate insulating layer 125P may be formed between the dummy gate electrode 120P and the first fin-type pattern 110.

For example, the dummy gate insulating layer 125P may be a silicon oxide layer, and the dummy gate electrode 120P may include polysilicon or amorphous silicon.

Figure 17:
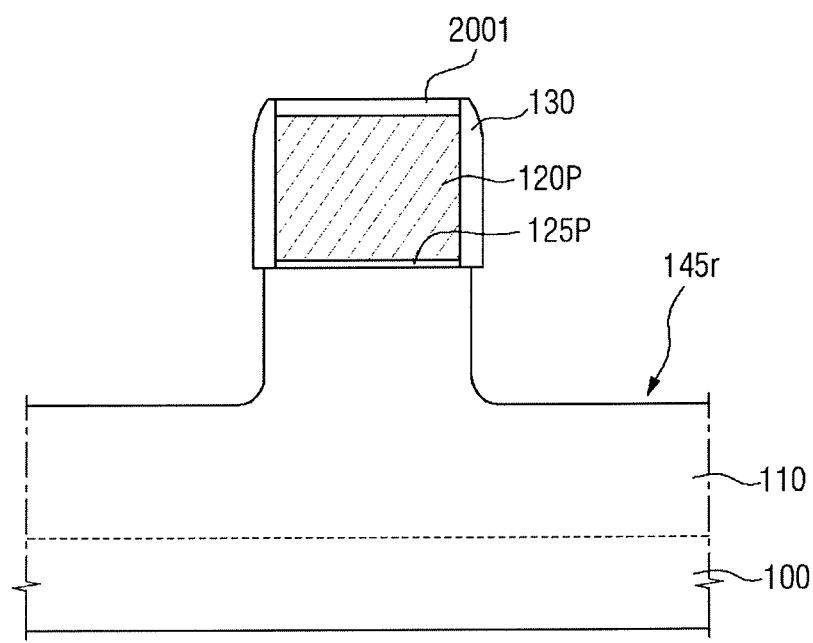

Referring to FIG. 17, the first spacer 130 may be formed on the sidewall of the dummy gate electrode 120P.

Further, while the first spacer 130 is formed, the first recess 145r may be formed within the first fin-type pattern 110. The first recess 145r may be formed on both sides of the dummy gate electrode 120P.

Figure 18:
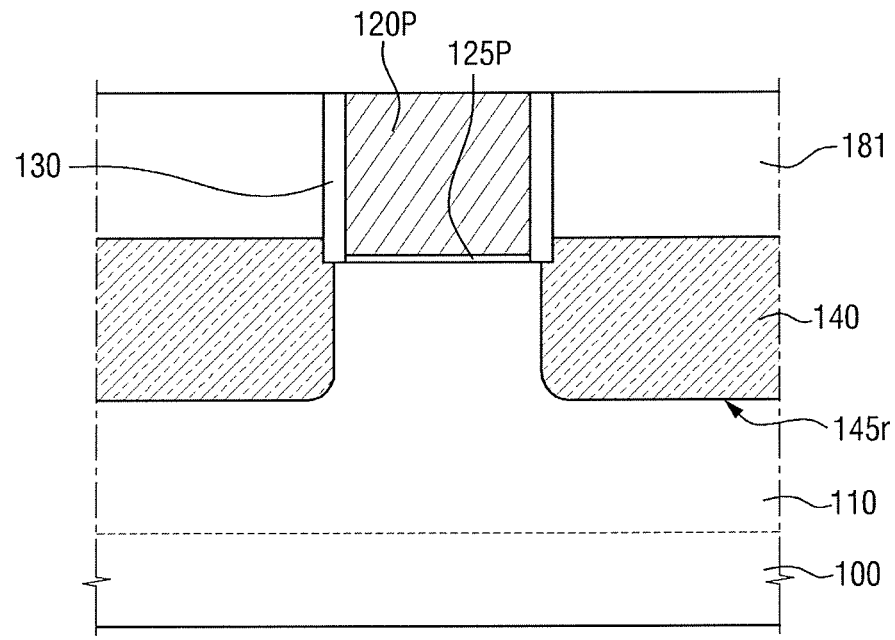

Referring to FIG. 18, the first source/drain 140 may be formed on both sides of the dummy gate electrode 120P and within the first fin-type pattern 110.

The first source/drain 140 may be formed to fill the first recess 145r. In an exemplary embodiment, the first source/drain 140 may be formed of an epitaxial layer.

The first interlayer insulating layer 181 may then be formed, covering the first fin-type pattern 110, the dummy gate electrode 120P and the first source/drain 140.

The first interlayer insulating layer 181 may be planarized until the upper surface of the dummy gate electrode 120P is exposed. In this case, the mask pattern 2001 may be removed.

For example, the first interlayer insulating layer 181 may be formed on the substrate 100, exposing the upper surface of the dummy gate electrode 120P.

Figure 19:
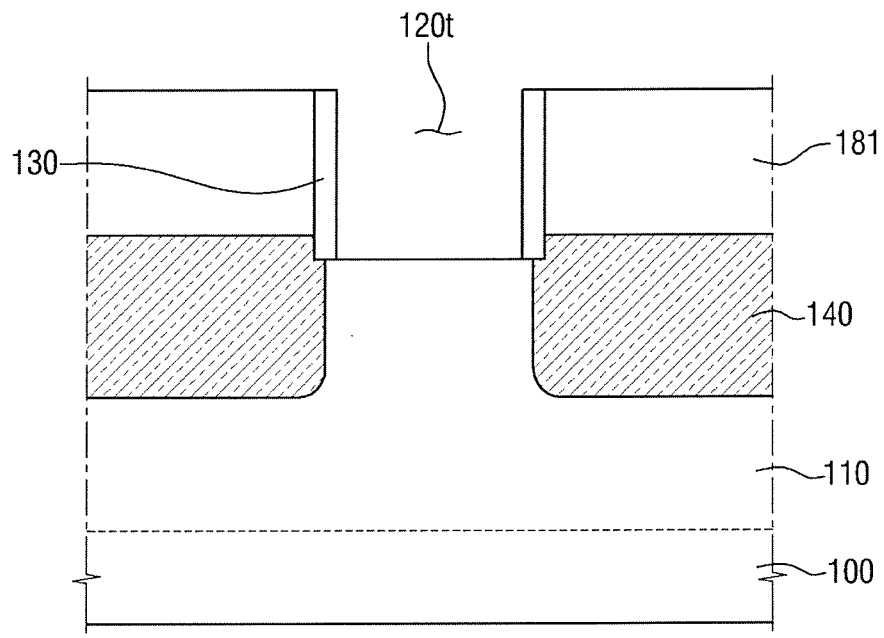

Referring to FIG. 19, the dummy gate electrode 120P and the dummy gate insulating layer 125P may be removed.

The removal of the dummy gate electrode 120P and the dummy gate insulating layer 125P may form the first trench 120t and may expose the first fin-type pattern 110 through the first trench 120t of the first interlayer insulating layer 181.

Figure 20:
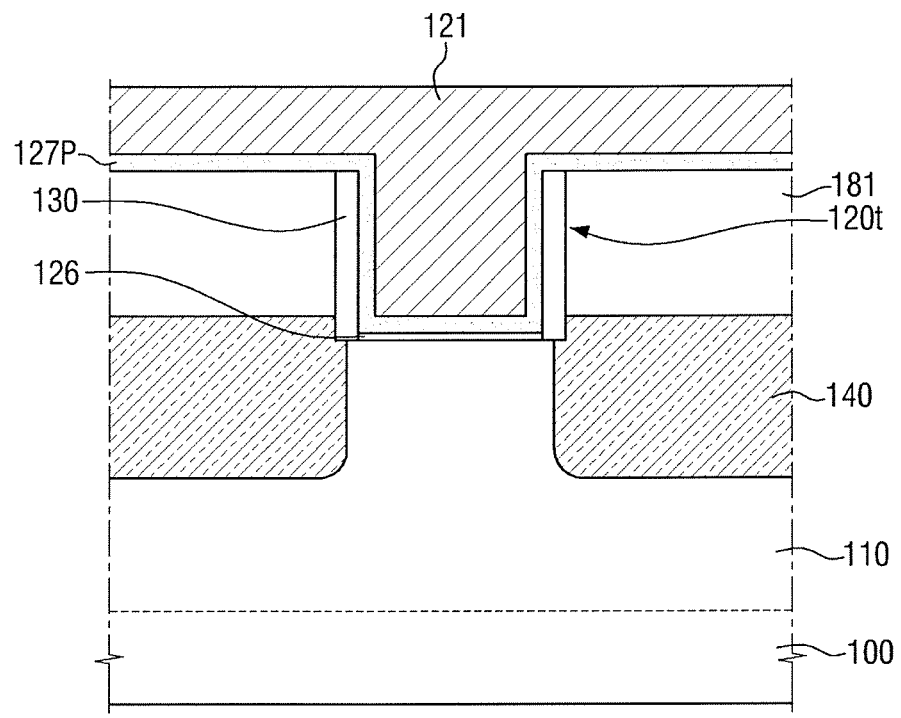

Referring to FIG. 20, the first interfacial layer 126 may be formed on the first fin-type pattern 110 which is exposed by the first trench 120t.

The first interfacial layer 126 may be formed on the bottom surface of the first trench 120t.

A preliminary gate dielectric film 127P may then be formed on the sidewall and the bottom surface of the first trench 120t, and on the upper surface of the first interlayer insulating layer 181.

Further, a metal electrode layer 121 may be formed on the preliminary gate dielectric film 127P, filling the first trench 120t and covering the upper surface of the first interlayer insulating layer 181. In an exemplary embodiment, the metal electrode layer 121 may be formed of tungsten (W).

Figure 21:
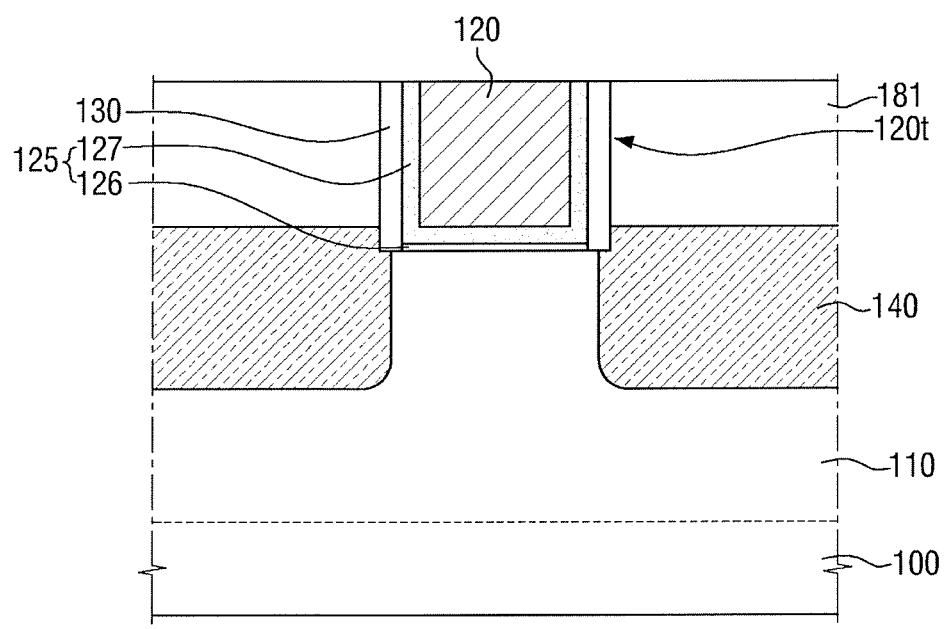

Referring to FIG. 21, the first high-k dielectric gate insulating layer 127 may be formed by removing the preliminary gate dielectric film 127P from the upper surface of the first interlayer insulating layer 181.

Further, the first gate electrode 120 may be formed within the first trench 120t by removing the metal electrode layer 121 from the upper surface of the first interlayer insulating layer 181.

The metal electrode layer 121 on the upper surface of the first interlayer insulating layer 181 may be removed by the planarization process. For example, the first gate electrode 120 may be formed in the process of the planarization process where the metal electrode layer 121 formed on the upper surface of the first interlayer insulating layer 181 is removed. In an exemplary embodiment, the planarization process may include a chemical-mechanical-polish (CMP) process.

Accordingly, the upper surface of the first interlayer insulating layer 181 may be coplanar with the upper surface of the first gate electrode 120.

Figure 22:
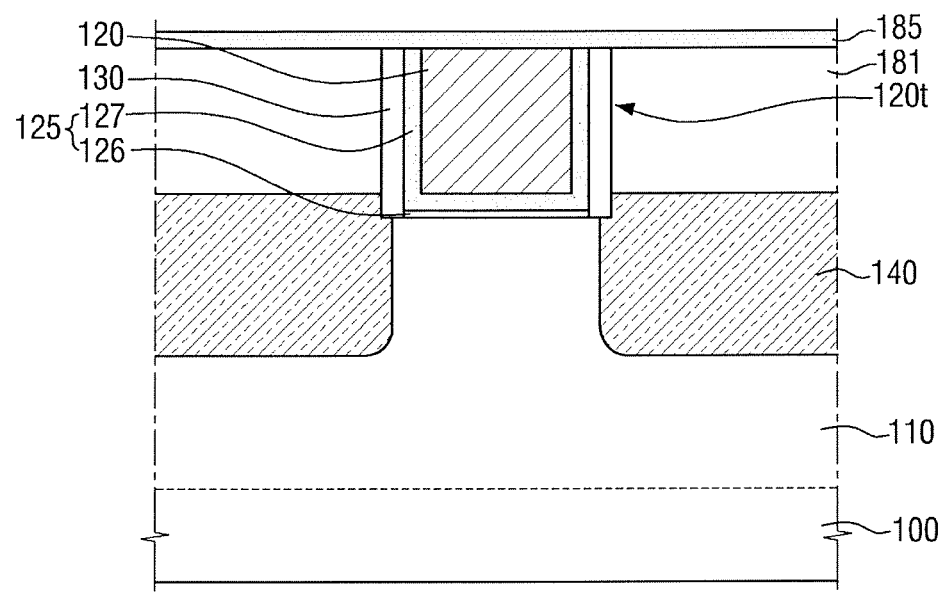

Referring to FIG. 22, the capping layer 185 may be formed on the upper surface of the first gate electrode 120 and on the upper surface of the first interlayer insulating layer 181. In an exemplary embodiment, the capping layer 185 may formed after the planarization process described with reference to FIG. 21.

The capping layer 185 may extend along the upper surface of the first gate electrode 120 and the upper surface of the first interlayer insulating layer 181.

Referring back to FIG. 2, the second interlayer insulating layer 182 may be formed on the capping layer 185.

Figure 23:
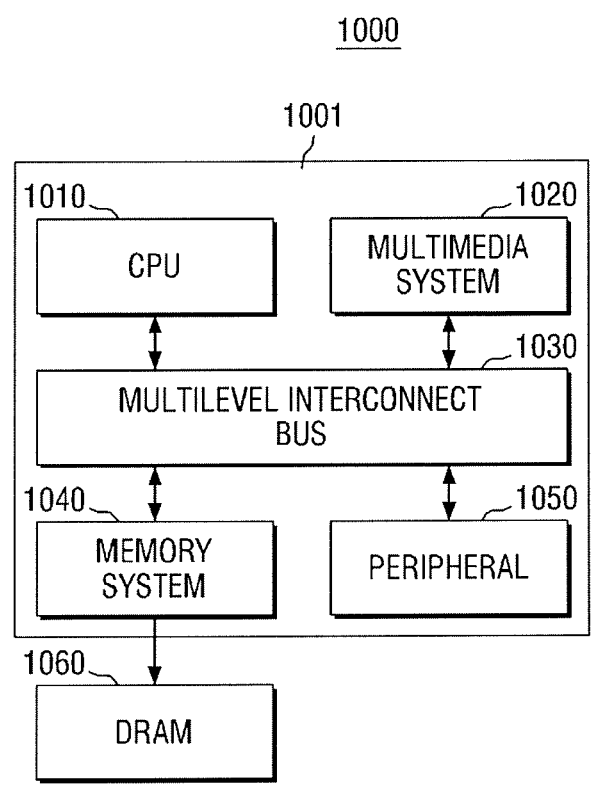
FIG. 23 is a block diagram of a system-on-a-chip (SoC) system comprising a semiconductor device according to an exemplary embodiment of the present inventive concept.

FIG. 23 is a block diagram of an SoC system comprising a semiconductor device according to an exemplary embodiment.

Referring to FIG. 23, an SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for the driving of the SoC system 1000. In an exemplary embodiment, the CPU 1010 may be configured on a multi-core environment which includes a plurality of cores.

The multimedia system 1020 may be used for performing a variety of multimedia functions on the SoC system 1000. The multimedia system 1020 may include a three-dimensional (3D) engine module, a video codec, a display system, a camera system, or a post-processor.

The bus 1030 may be used for exchanging data communication among the CPU 1010, the multimedia system 1020, the memory system 1040 and the peripheral circuit 1050. In some exemplary embodiments, the bus 1030 may have a multi-layer structure. Specifically, an example of the bus 1030 may be a multi-layer advanced high-performance bus (AHB), or a multi-layer advanced eXtensible interface (AXI), and the present inventive concept is not limited herein.

The memory system 1040 may provide environments necessary for the application processor 1001 to connect to an external memory (e.g., DRAM 1060) and perform high-speed operation. In some exemplary embodiments, the memory system 1040 may include a separate controller (e.g., DRAM controller) to control an external memory (e.g., DRAM 1060).

The peripheral circuit 1050 may provide environments necessary for the SoC system 1000 to have a seamless connection with an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In an exemplary embodiment, the DRAM 1060 may be arranged externally to the application processor 1001, as illustrated. For example, the DRAM 1060 may be packaged into a package on package (PoP) type with the application processor 1001.

At least one of the above-mentioned components of the SoC system 1000 may include a semiconductor device according to an exemplary embodiment.

Figure 24:
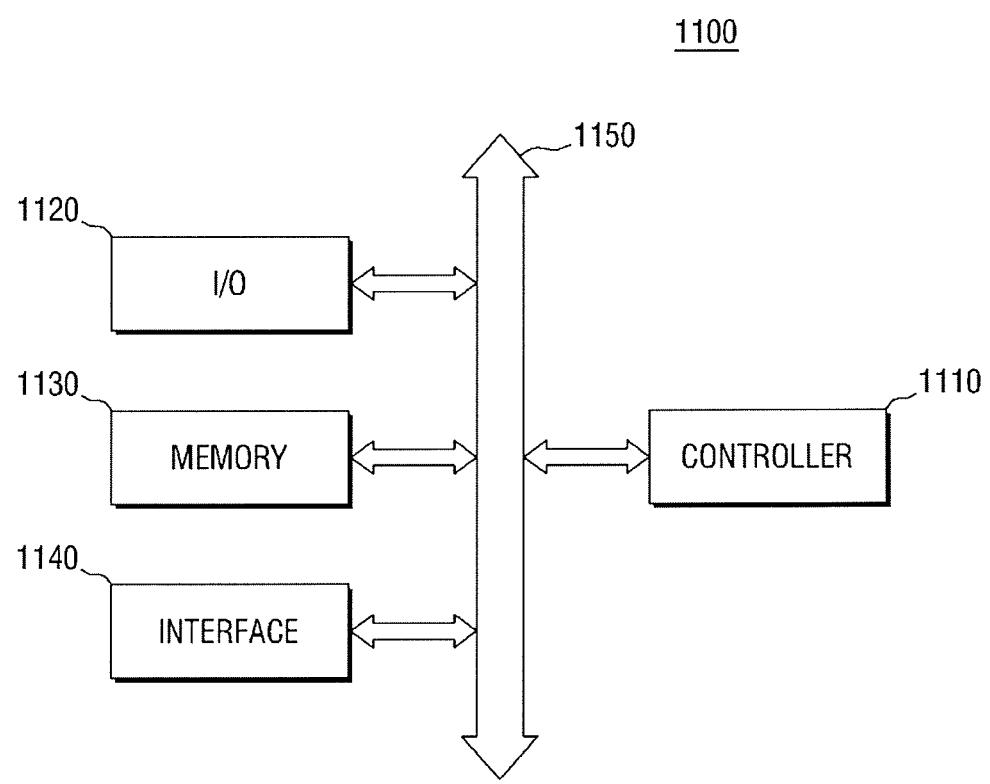
FIG. 24 is a block diagram of an electronic system comprising a semiconductor device according to an exemplary embodiment of the present inventive concept.

FIG. 24 is a block diagram of an electronic system comprising a semiconductor device according to an exemplary embodiment.

Referring to FIG. 24, the electronic system 1100 according to an exemplary embodiment may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of microprocessor, digital signal processor, micro controller and logic devices capable of performing functions similar to those mentioned above. The I/O device 1120 may include a keypad, a keyboard or a display device. The memory device 1130 may store data and/or commands. The interface 1140 may perform a function of transmitting or receiving data to or from communication networks. The interface 1140 may be wired or wireless. For example, the interface 1140 may include an antenna or a wired/wireless transceiver.

Although not illustrated, the electronic system 1100 may additionally include an operation memory configured to enhance operation of the controller 1110, such as a high-speed dynamic random-access memory (DRAM) and/or a static random access memory (SRAM).

The memory device 1130, the controller 1110 or the I/O device 1120 may include a semiconductor device according to an exemplary embodiment.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

Figure 25:
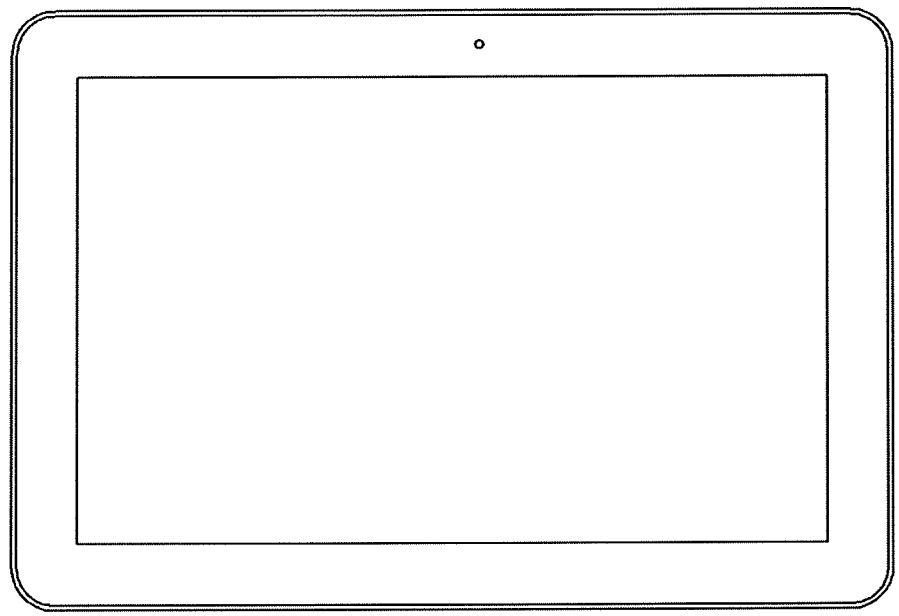
FIGS. 25 to 27 show semiconductor systems including a semiconductor device according to an exemplary embodiment of the present inventive concept.
Figure 27:
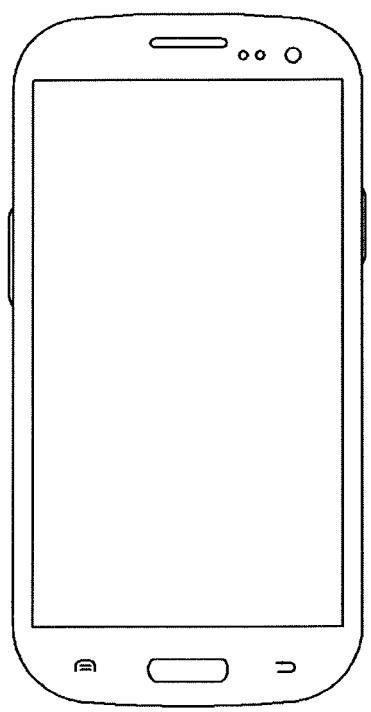

FIGS. 25 and 27 illustrate semiconductor systems including a semiconductor device according to an exemplary embodiment.

Figure 26:
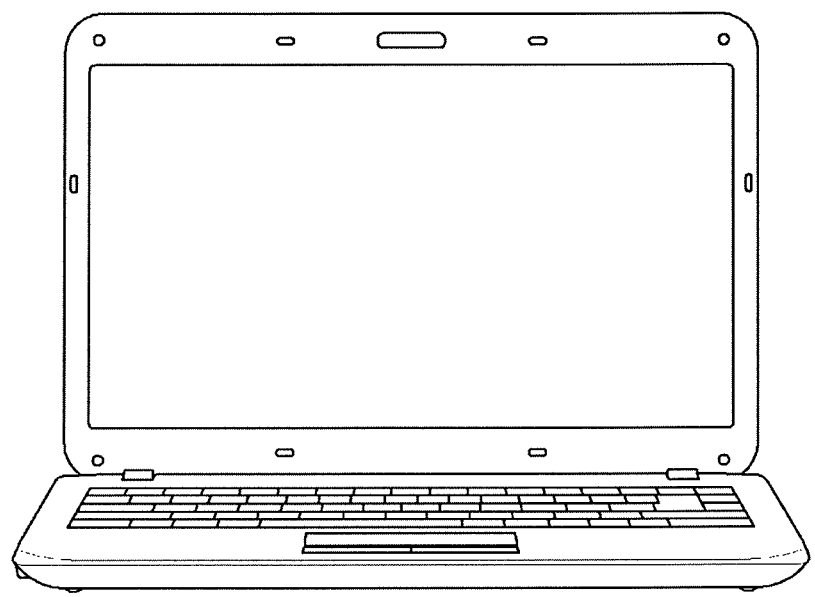

FIG. 25 illustrates a tablet PC 1200, FIG. 26 illustrates a laptop computer 1300, and FIG. 27 illustrates a smartphone 1400. The tablet PC 1200, the laptop computer 1300 or the smartphone 1400 may include a semiconductor device according to an exemplary embodiment.

Further, another integrated circuit device not illustrated herein may include a semiconductor device according to an exemplary embodiment.

For example, while the tablet PC 1200, the laptop computer 1300 and the smartphone 1400 are exemplified herein as a semiconductor system according to an exemplary embodiment, the exemplary semiconductor system is not limited thereto.

For example, the semiconductor system may include a computer, a ultra mobile PC (UMPC), a workstation, a net-book, personal digital assistants (PDA), a portable computer, a wireless phone, a mobile phone, an e-book, a portable multimedia player (PMP), a portable game player, a navigation device, a black box, a digital camera, a three-dimensional television, a digital audio recorder, a digital audio player, a digital picture recorder, a digital picture player, a digital video recorder, or a digital video player.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
a first fin-type pattern disposed on a substrate;
a first interlayer insulating layer disposed on the substrate, covering the first fin-type pattern and including a first trench, the first trench intersecting the first fin-type pattern;
a first gate electrode disposed on the first fin-type pattern, the first gate electrode filling the first trench, an upper surface of the first gate electrode being coplanar with an upper surface of the first interlayer insulating layer, wherein the first gate electrode is formed of a conductive material;
a capping layer covering the upper surface of the first interlayer insulating layer and the upper surface of the first gate electrode, wherein the capping layer includes an insulating material; and
a second interlayer insulating layer disposed on the capping layer, the second interlayer insulating layer including a material different from that of the capping layer.

2. The semiconductor device of claim 1, wherein the capping layer is formed of silicon nitride, and the second interlayer insulating layer is formed of oxide.

3. The semiconductor device of claim 1, wherein the capping layer is in contact with the first gate electrode.

4. The semiconductor device of claim 1, further comprising:
a source/drain formed on both sides of the first gate electrode and being formed of an epitaxial layer,
wherein the first interlayer insulating layer is interposed between the capping layer and the source/drain.

5. The semiconductor device of claim 4, further comprising:
an etch-stop layer is interposed between the source/drain and the first interlayer insulating layer.

6. The semiconductor device of claim 5, wherein the etch-stop layer is in contact with the capping layer.

7. The semiconductor device of claim 1, wherein the capping layer is in contact with the first interlayer insulating layer and the second interlayer insulating layer.

8. The semiconductor device of claim 1, further comprising:
a second fin-type pattern; and
a second gate electrode intersecting the second fin-type pattern,
wherein the first interlayer insulating layer covers the second fin-type pattern and includes a second trench intersecting the second fin-type pattern, and
the second gate electrode is formed by filling the second trench.

9. The semiconductor device of claim 8, wherein an upper surface of the second gate electrode and the upper surface of the first interlayer insulating layer are coplanar with each other.

10. The semiconductor device of claim 8, wherein the capping layer further covers an upper surface of the second gate electrode.

11. The semiconductor device of claim 8, wherein the second interlayer insulating layer is formed on the second gate electrode, and the second interlayer insulating layer and the second gate electrode are in contact with each other.

12. The semiconductor device of claim 11, wherein the substrate includes an N-type transistor region and a P-type transistor region, and
the first fin-type pattern is formed in the N-type transistor region, and the second fin-type pattern is formed in the P-type transistor region.

13. A semiconductor device, comprising:
a fin-type pattern;
a first interlayer insulating layer covering the fin-type pattern and including a trench, the trench intersecting the fin-type pattern and exposing a portion of the fin-type pattern;
an interfacial layer disposed on the portion of the fin-type pattern;
a high-k dielectric insulating layer disposed on the interfacial layer, the high-k dielectric insulating layer being disposed along a sidewall and a bottom surface of the trench;
a gate electrode disposed on the high-k dielectric insulating layer, the gate electrode filling the trench, wherein the gate electrode is formed of a conductive material;
a silicon nitride (SiN) capping layer disposed on an upper surface of the first interlayer insulating layer and on an upper surface of the gate electrode, wherein the SiN capping layer is in contact with the first interlayer insulating layer and the gate electrode; and
a second interlayer insulating layer disposed on the SiN capping layer, the second interlayer insulating layer including oxide.

14. The semiconductor device of claim 13, wherein a thickness of the SiN capping layer ranges from about 3 Å and about 60 Å.

15. The semiconductor device of claim 13, wherein the gate electrode includes a first TiN layer, a TiAlC layer, and a second TiN layer, stacked on each other in the listed order, disposed on the high-k dielectric insulating layer.

16. The semiconductor device of claim 13, further comprising:
a source/drain formed on both sides of the gate electrode and being formed of an epitaxial layer, and
an etch-stop layer formed on the source/drain,
wherein the first interlayer insulating layer is interposed between the SiN capping layer and the etch-stop layer.

17. The semiconductor device of claim 16, wherein the etch-stop layer includes silicon nitride.

18. A semiconductor device, comprising:
a fin-type pattern disposed on a substrate;
a first interlayer insulating layer disposed on the substrate, covering the fin-type pattern and including a trench, the trench intersecting the fin-type pattern;
a gate electrode disposed on the fin-type pattern, the gate electrode filling the trench, an upper surface of the gate electrode being coplanar with an upper surface of the first interlayer insulating layer, wherein the gate electrode is formed of a conductive material;
a capping layer covering the upper surface of the first interlayer insulating layer and the upper surface of the gate electrode, wherein the capping layer includes an insulating material, and wherein the capping layer is in contact with the gate electrode; and
a second interlayer insulating layer disposed on the capping layer.

19. The semiconductor device of claim 18,
wherein the capping layer is formed of silicon nitride, and the second interlayer insulating layer is formed of oxide.

20. The semiconductor device of claim 18, further comprising:
a source/drain formed on both sides of the gate electrode and being formed of an epitaxial layer, and
an etch-stop layer formed on the source/drain,
wherein the first interlayer insulating layer is interposed between the capping layer and the etch-stop layer.

* * * * *